US006485603B1

(12) United States Patent
Yee et al.

(10) Patent No.: US 6,485,603 B1
(45) Date of Patent: Nov. 26, 2002

(54) METHOD AND APPARATUS FOR CONSERVING ENERGY WITHIN A PROCESS CHAMBER

(75) Inventors: Nelson Yee, Redwood City; Matthew Tsai, Cupertino, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/346,073

(22) Filed: Jul. 1, 1999

(51) Int. Cl.[7] .............................................. C23C 16/46
(52) U.S. Cl. ............................... 156/345.45; 118/50.1; 118/641; 118/638; 118/723 E; 156/345.48
(58) Field of Search .................................. 118/720, 721, 118/728, 500, 504, 620, 641, 50.1, 666, 715; 156/345; 204/298.11; 414/225, 757; 117/2, 85, 86; 219/390; 422/173, 180; 427/237; 451/28, 36, 41, 56, 57, 59

(56) References Cited

U.S. PATENT DOCUMENTS

| 3,713,471 A | * | 1/1973 | Sadler ........................... 83/523 |
| 3,783,822 A | * | 1/1974 | Wollam ......................... 118/725 |
| 4,399,016 A | | 8/1983 | Tsukada et al. .............. 156/345 |
| 4,502,750 A | * | 3/1985 | Neidig et al. ................ 439/874 |
| 4,632,719 A | | 12/1986 | Chow et al. ................. 156/345 |
| 4,836,138 A | * | 6/1989 | Robinson et al. ........... 118/666 |
| 4,842,683 A | * | 6/1989 | Cheng et al. ................ 156/345 |
| 4,902,531 A | * | 2/1990 | Nakayama et al. ............ 427/39 |
| 5,273,588 A | * | 12/1993 | Foster et al. ............. 118/723 E |
| 5,879,128 A | * | 3/1999 | Tietz et al. .................. 414/757 |
| 6,093,253 A | * | 7/2000 | Lofgren et al. ............. 118/725 |

FOREIGN PATENT DOCUMENTS

| JP | 402304191 | * | 1/1990 | |
| JP | 2-238619 | * | 9/1990 | ......... H01L/21/205 |
| JP | 10-321547 | * | 12/1998 | ........... H01L/21/26 |

* cited by examiner

Primary Examiner—Gregory Mills
Assistant Examiner—Rudy Zervigon
(74) Attorney, Agent, or Firm—Moser, Patterson & Sheridan

(57) ABSTRACT

An apparatus for redirecting energy applied to a susceptor of a substrate process chamber. Specifically, a shield comprising one or more reflector members is disposed below said susceptor whereby thermal energy radiated from a backside of said susceptor is reflected back to the susceptor. The apparatus comprises a bracket member attached to the reflector members and a pedestal assembly disposed below said susceptor. The reflector members are fabricated from a low emissivity material such as stainless steel (which can be polished to a highly reflective condition). Also, the first and second reflector members can be annealed.

18 Claims, 3 Drawing Sheets

METHOD AND APPARATUS FOR CONSERVING ENERGY WITHIN A PROCESS CHAMBER

BACKGROUND OF THE DISCLOSURE

1. Field of the Invention

The present invention relates to semiconductor wafer processing equipment and, more particularly, to a method and apparatus for conserving and redirecting power applied to a substrate support.

2. Description of the Background Art

Within a process chamber of a substrate processing system, a substrate, such as a semiconductor wafer, is typically supported by a substrate support or susceptor while being processed. The susceptor is in turn supported by a pedestal assembly. The pedestal assembly houses attendant components to assist in substrate processing including but not limited to power supply connections, gas conduits and the like. To facilitate processing of the wafer, the susceptor is heated to raise the temperature of the wafer during one or more of the process steps. To facilitate heat transfer to/from the wafer, the susceptor is fabricated from a ceramic material and a heating member such as a resistive heater element is embedded therein, or pressed thereagainst. Additionally, a heat sink such as a liquid cooled block may be disposed below the susceptor. The heater element is generally a coil of resistive wire or a metallized layer fabricated from a material such as tungsten. When power is applied to this wire or layer, the element generates heat that conducts through the ceramic to the wafer.

Generally the power applied to the susceptor is on the order of 1000W. During initial heating of the susceptor and wafer (referred to as ramp-up) and subsequent cooling, the susceptor may break if it does not have sufficient thermal uniformity characteristics or too much power is applied to it. That is, the thermal stresses on the susceptor material caused by the application of the power will cause the susceptor to crack, thereby necessitating its' replacement.

Thermal uniformity of the susceptor is not only dependent upon the susceptor material, but also upon the configuration of the susceptor and its support, known as a pedestal. The industry standard for semiconductor wafers is a 200 mm diameter, thus the susceptor is slightly larger. Recent improvements in this area of technology and the natural evolution of the field is allowing for larger substrates (on the order of a 300 mm diameter). Regardless of the susceptor size, the pedestal assembly is smaller in diameter than the susceptor. As such, a certain amount of heat radiates from the backside of the susceptor and into the chamber where the susceptor overhangs its backing structure of the pedestal. This radiative heat loss increases in a radial direction as one moves away from the center of the susceptor. Additionally, the thermal gradients in the susceptor may result in similar gradients on the substrate. Non-uniform substrate temperatures result in degraded substrate conditions (poorly formed layers or variable properties in the layers or the like).

Typically, the pedestal includes a temperature regulating member, such as a resistance wire heater, fluid channels, etc., therein to raise or lower the temperature of the susceptor and thus of the wafer. Where the pedestal is immediately under the susceptor, the susceptor temperature will be correlative with the temperature of the area of the pedestal immediately behind it. Since the pedestal assembly is smaller than the susceptor, the heat flux to the overhanging region of the susceptor comes to/from the pedestal through the susceptor, or radiatively off of the side of the pedestal rather than directly from the pedestal. Thus the greatest temperature variation leading to non-uniformity occurs at the circumference of the susceptor where the susceptor and pedestal are not positioned against each other. It has been further realized that the radiative heat losses rise significantly as susceptor diameter increases where pedestal diameter is maintained constant. For example, a substantial amount of backside surface area of a 300 mm susceptor is not covered by its pedestal assembly in comparison to a 200 mm susceptor. Therefore, there is a greater amount of heat radiating from the 300 mm susceptor backside into the process chamber resulting in a heat loss condition at the susceptor and consequently, the wafer. As such, an increased amount of power (current) must be applied to the susceptor to maintain the desired operating temperature. The increase in power can exceed the design constraints of the pedestal assembly/susceptor thereby causing irreparable damage. Two possible forms of damage are the aforementioned ceramic cracking and fusing, oxidizing or general degrading of the power terminals that connect the susceptor to a power supply. Further, the overhanging portion will have a substantial temperature gradient leading to non-uniform film (layer) properties.

Therefore, there is a need in the art for a method and apparatus for conserving heat along the overhanging portion of a susceptor to maintain greater temperature uniformity across its diameter. Such apparatus would be capable of reducing the thermal gradients in ceramic susceptors in general and to a greater extent for susceptors that have enlarged radiating surfaces thereby compensating for radiative heat losses of same.

SUMMARY OF THE INVENTION

The disadvantages heretofore associated with the prior art are overcome by the present invention of an apparatus for redirecting energy applied to a susceptor of a substrate process chamber. Specifically, the apparatus is a shield comprising one or more reflector members disposed within said process chamber. The reflector members are disposed below said susceptor whereby thermal energy radiated from a backside of said susceptor is reflected back to the susceptor.

The apparatus further comprises a bracket member proximate said reflector members which more specifically is attached to a pedestal assembly disposed below said susceptor. The bracket member has an arcuate portion that is provided with a plurality of openings. Fastening means communicate with said arcuate portion openings (preferably four of each) and said pedestal assembly.

The bracket member further has a first vertical portion transitioning from said arcuate portion and a second vertical portion transitioning from said arcuate portion. A first horizontal portion then transitions from said first vertical portion and a second horizontal portion transitions from said second vertical portion. The first and second horizontal portions each have a first flange and a second flange. The first and second flanges of the first horizontal portion have a plurality of flange openings as does the first and second flanges of the second horizontal portion. Preferably, there are three openings per flange.

A first reflector member and a second reflector member are supported by said bracket member. The first reflector member and the second reflector member each have a first end and a second end. Each of said first and second ends of the first and second reflector members have a flange. The flange on the first end of the first reflector member has a plurality of openings that coincide with the plurality of openings on the second flange of the first horizontal portion of the bracket member and the flange on the second end of the first reflector member has a plurality of openings that coincide with the plurality of openings on the second flange of the second horizontal portion of the bracket member. Similarly, the flange on the first end of the second reflector member has a plurality of openings that coincide with the plurality of openings on the first flange of the first horizontal portion of the bracket member and the flange on the second end of the second reflector member has a plurality of openings that coincide with the plurality of openings on the first flange of the second horizontal portion of the bracket member. With this arrangement, the first and second reflector members are attached to the bracket member via communication of a fastening means with the coinciding plurality of openings. Such fastening means can be bolts threaded through the coinciding openings, nut and bolt pairings, rivets, welds and dowels and the like.

The first and second reflector members have one or more lift pin access holes. Preferably, there are two lift pin access holes provided on the first reflector member and there is one lift pin access hole provided on the second reflector member. Further, the first and second reflector members are fabricated from a low emissivity material such as stainless steel (which can be polished to a highly reflective condition). Also, the first and second reflector members can be annealed.

With the apparatus as described, energy conservation can be achieved in the process chamber. Energy that would have otherwise been radiated by the susceptor and absorbed by other chamber components is instead reflected back to the susceptor. As such, less power is required to maintain the susceptor at process temperatures and the likelihood of nonuniform thermal conditions across the susceptor is greatly reduced.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
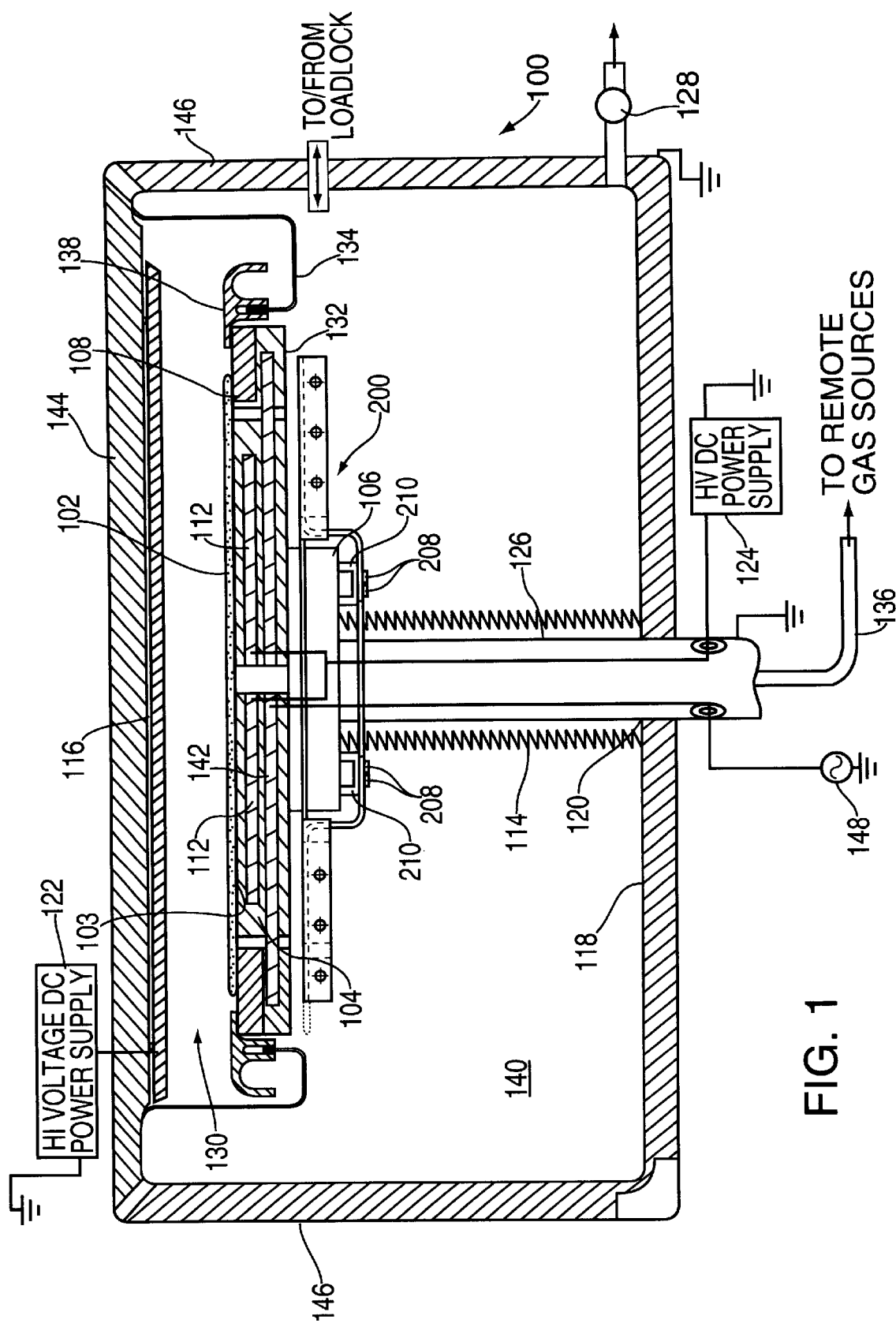
FIG. 1 depicts a partial cross-sectional view of a process chamber and susceptor having a shield member in accordance with the present invention.

FIG. 1 depicts a partial cross-sectional view of a substrate process chamber 100 for processing substrates such as a semiconductor wafer 102. The process chamber 100 contains the necessary hardware and components to perform semiconductor wafer processing, particularly physical vapor deposition (PVD). For a detailed understanding of a PVD processing chamber and its operation in processing a wafer, the reader should refer to the drawings and the detailed description contained in commonly assigned U.S. Pat. No. 5,228,501, issued Jul. 20, 1993 incorporated herein by reference. That disclosure discloses a wafer support assembly used in a physical vapor deposition chamber manufactured by Applied Materials, Inc. of Santa Clara, Calif. The process chamber 100 further comprises a novel device for conserving energy that is radiatively dissipated from the chamber components so as to reduce the power necessary to perform processing and prolong component lifetime. Although the present invention is described in relation to a PVD process chamber with a 300 mm susceptor, its application is not limited solely to such an apparatus. The invention may also be used in other types of process chambers (i.e., etch or chemical vapor deposition (CVD), different size susceptors, (i.e., 200 mm) or in any similar situation where conservation of radiative power is desired.

Specifically and as shown in FIG. 1, the process chamber 100 forms an enclosure 140 by floor 118, sidewalls 146 and lid 144. The process chamber 100 further comprises a substrate support or susceptor 104. The susceptor 104 further comprises a backside 132 and one or more chucking electrodes 112 disposed within the susceptor 104. The electrodes 112 are connected to a power supply 124 for electrostatically chucking the wafer 102 to a support surface 103 of the susceptor 104. Additionally, a heater 142 is also disposed within the susceptor 104. The heater is connected to a power supply 148 (i.e., a 120/208V AC source) for elevating the temperature of the susceptor 104, hence the wafer 102 to a temperature suitable for PVD processing. For example, the heater 142 is capable of generating sufficient thermal energy to raise the susceptor temperature to approximately 550° C. Waste ring 108, cover ring 138 and deposition shield 134 circumscribe the susceptor 104 to separate a process region 130 from the remaining portion of the enclosure 140 and to prevent unwanted deposition within the enclosure 140.

The susceptor 104 is supported by a pedestal assembly 106 disposed therebelow. A diameter of the pedestal assembly is less than a diameter of the susceptor. The susceptor 104 is connected to the pedestal assembly 106 by any number of acceptable connecting member known to those in the art and include but are not limited to brazing and mechanical fasteners (i.e., bolts, screws or the like). The pedestal assembly 106 is supported by a shaft 126 disposed therebelow. The shaft 126 extends through an opening 120 in the floor 118 of the process chamber 100. The shaft 126 is further sheathed in a bellows 114 to provide a vacuum tight seal between a chamber atmosphere and an external atmosphere. The shaft 126 is also provided with components useful for chamber processing such as a gas conduit 136. The gas conduit communicates with one or more remote gas sources (not shown) and a backside gas port 110 disposed in the susceptor 104.

A target 116 of sputtering or deposition material is positioned over the susceptor 104. Specifically, the target 116 is attached to the lid 144 or alternately is a unitary piece that functions as the lid as well as the target. The target 116 is usually Aluminum or Titanium and is electrically insulated from the chamber 100. Power source 122 is preferably a high voltage DC power supply and is electrically connected between the target 116 and susceptor 104 for magnetron sputtering the wafer 102.

Additionally, and in accordance with the present invention, an apparatus 200 for conserving and reflecting radiated energy is disposed below the susceptor 104.

Specifically, a shield 200 is disposed below and preferably attached to the pedestal assembly 106 via a plurality of securing members 208 which are readily known and available to those skilled in the art of susceptor design and fabrication. The securing members 208 can be selected from the group consisting of threaded bolts, rivets, adhesive lined dowels or pins and the like. The shield 200 is spaced apart from the pedestal assembly 106 via a plurality of spacers 210 provided between the pedestal assembly 106 and the shield 200. That is, the spacers 210 accommodate the securing members 208 when attaching the shield 200 to the pedestal assembly 106.

Figure 3:
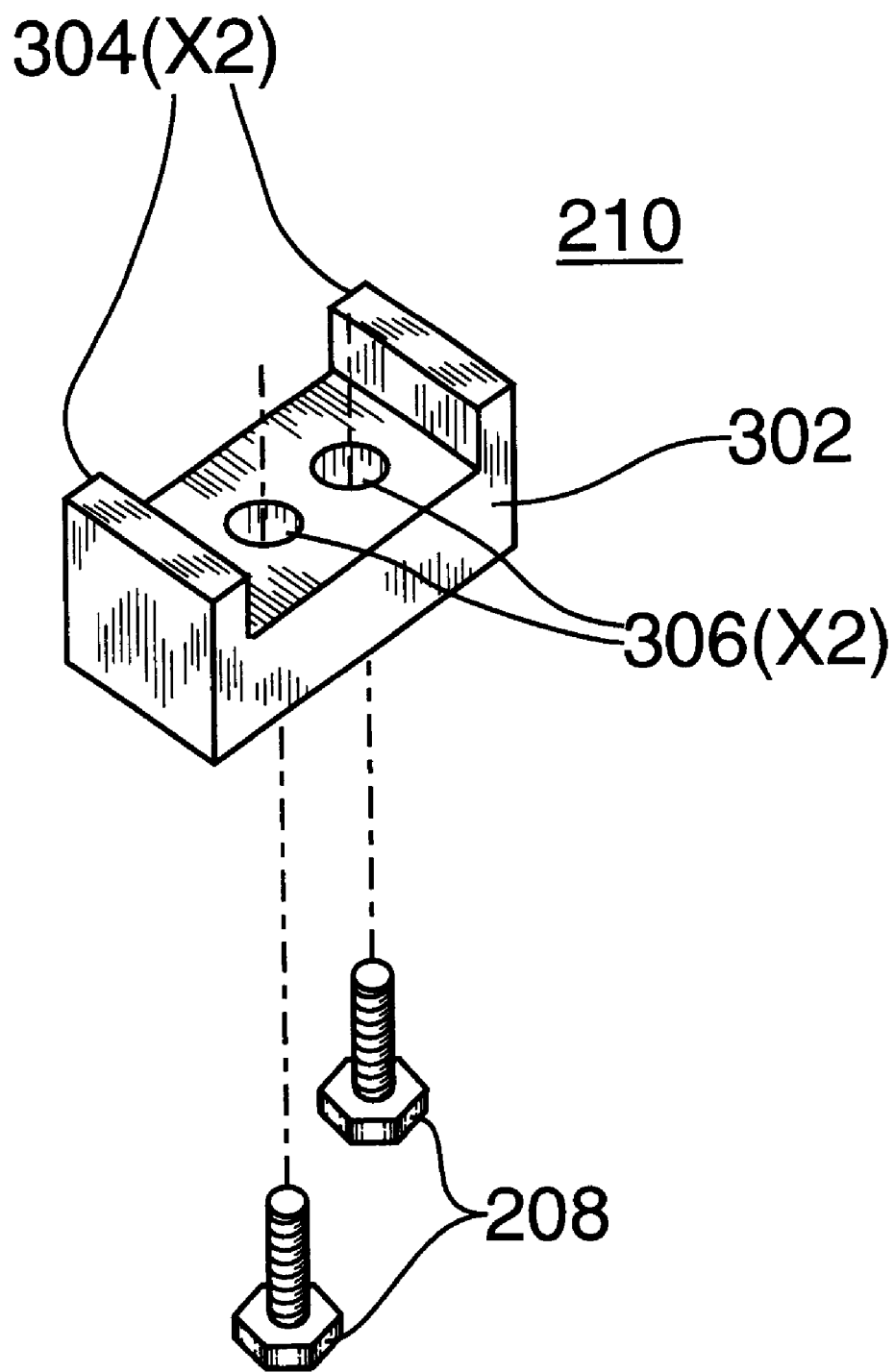
FIG. 3 depicts a detailed view of a spacer member of the present invention.

FIG. 3 depicts one of the spacers 210 in greater detail. Specifically, the spacer 210 comprises a central body 302 and a plurality of legs 304 extending upward from the central body 302. The central body further defines a plurality of openings 306 through which a plurality of securing members 208 communicate. In a preferred embodiment of the invention, there are two (2) legs 304, and two (2) openings 306 communicating with two securing members 208. Additionally, two (2) spacers 210 are used to secure the shield 200 to the pedestal assembly 106. The spacers are fabricated from a high temperature strength material such as stainless steel and are welded to the pedestal assembly 106 at the legs 304. Since stainless steel is a relatively poor thermal conductor, thermal energy from the heater does not effect the spacers 210 or shield 200. Additionally, the pedestal assembly 106 is grounded; therefore, stray electrical energy also has little or no deliterious effect on the spacers 210 or the shield 200.

Figure 2:
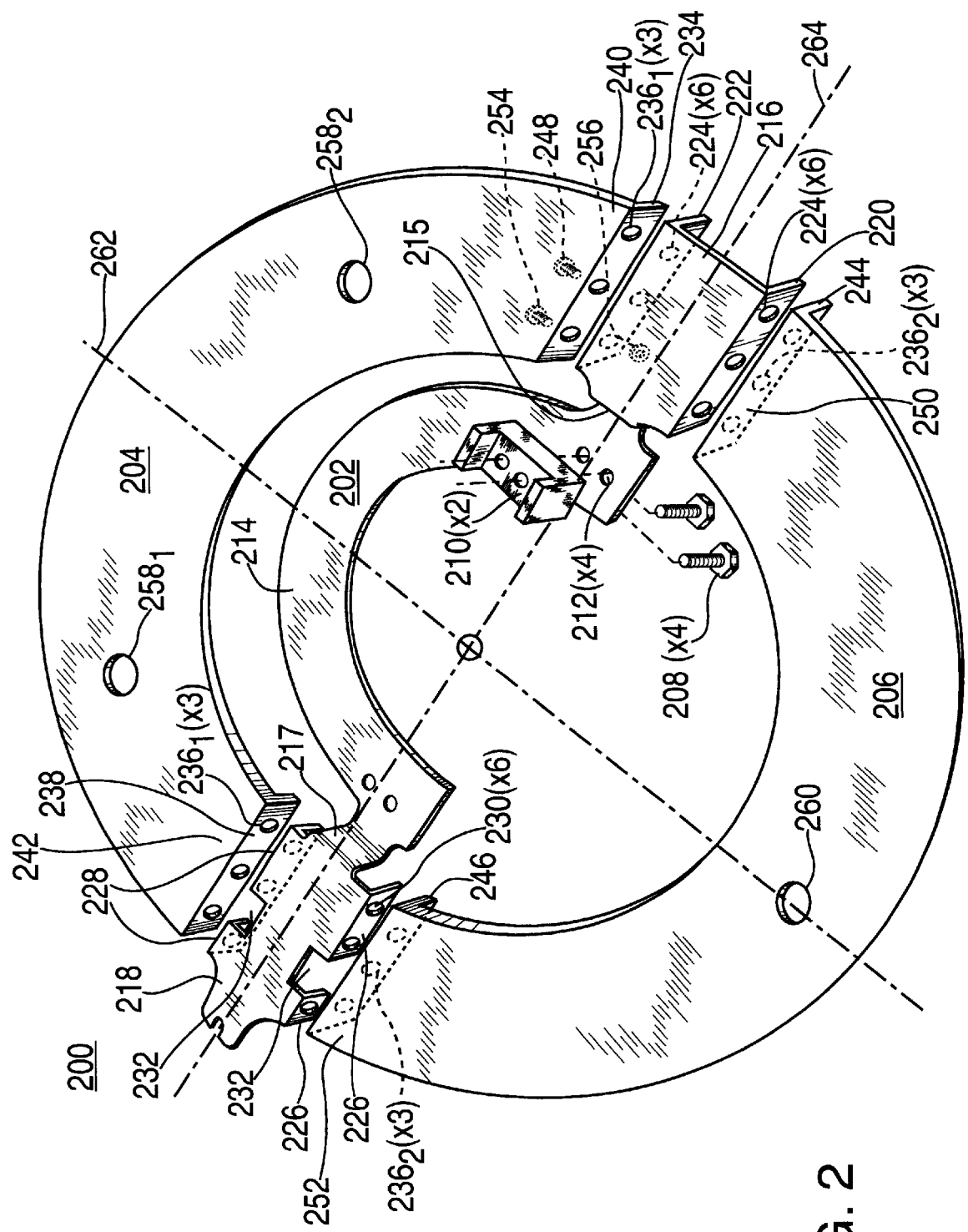
FIG. 2 depicts an exploded, perspective view of the shield member.

FIG. 2 depicts a partially exploded, perspective view of the shield 200 when it is not attached to the pedestal assembly 106. The shield comprises a bracket member 202 connected to one or more reflector members 204 and 206. The bracket member 202 further comprises an arcuate portion 214. The arcuate portion 214 is provided with a plurality of openings 212. The securing members 208 communicate with the openings 212 to secure the bracket member 202 to the pedestal assembly 106. In a preferred embodiment of the invention the arcuate segment 214 is a semi-circular shape and the plurality of openings 212 is 4. The arcuate portion 214 transitions to a first vertical portion 215 (partially obscured) and to a second vertical portion 217. Each of said vertical portions 215 and 217 respectively rise vertically upwards and perpendicular to the arcuate portion 214. First vertical portion 215 transitions to a first horizontal portion 216 and second vertical portion 217 transitions into a second horizontal portion 218. Each of said horizontal portions 216 and 218 are perpendicular to their respective vertical portions 215 and 217, and are co-planar and are parallel to the arcuate portion 214.

The first horizontal portion 216 further comprises a first flange 220 and a second flange 222. Each of said flanges 220 and 222 extend vertically downwards from the first horizontal portion 216. Further, each of said flanges 220 and 222 comprise a plurality of flange openings 224 (note that a portion of flange 222 and the openings in flange 222 are normally obscured from the view in FIG. 2 but are shown in dashed line format for completeness). In a preferred embodiment of the invention, there are three flange openings on each of said flanges 220 and 222.

Similar to the first horizontal portion 216, the second horizontal portion 218 comprises a first flange 226 and a second flange 228, each extending vertically downwards from the second horizontal portion 218. Also, each of said flanges 226 and 228 are further provided with flange openings 230. Again, a portion of flange 228 and the openings 230 in second flange 228 are partially obscured but shown in dashed line format. In a preferred embodiment of the invention, there are three openings 230 in each of said flanges 226 and 228. Additionally, the second horizontal portion 218 further comprises a plurality of notches 232. Preferably, the notches 232 extend from the horizontal portion 218 into said flanges 226 and 228.

The bracket member 202 is mated to one or more reflector members 204 and 206. That is, the first reflector member 204 and second reflector member 206 are fashioned so as to be connected to the bracket member 202. Specifically, first reflector member 204 is arcuately shaped and is preferably semi-circular having a first end 240 and a second end 242. The first end 240 of the first reflector member 204 has a flange 234. The flange 234 extends vertically downwards from the first end 240. The flange 234 further comprises a plurality of openings $236_1$ which coincide with the openings 224 on the second flange 222 of first horizontal portion 216 of the bracket member 202. Similarly, second end 242 further comprises a flange 238. The flange 238 extends vertically downwards from the second end 242. The flange 238 also further comprises a plurality of openings $236_1$. The openings $236_1$ coincide with the plurality of openings 230 on the second flange 228 of second horizontal portion 218 of bracket member 202. Resultantly, in a preferred embodiment of the invention, the plurality of openings $236_1$ on each of said first reflector member flanges 234 and 238 is three.

Second reflector member 206 is similar in design and layout to first reflector member 204. Specifically, second reflector member 206 is arcuately shaped and preferably semi-circular having a first end 250 and a second end 252. The first end 250 further comprises a flange 244 and second end 252 further comprises a flange 246. Each of said flanges 244 and 246 extend vertically downwards from their respective ends 250 and 252. Additionally, each of said flanges further comprises a plurality of openings $236_2$. Specifically, the openings $236_2$ provided in flange 244 meet and coincide with the openings 224 provided on the first flange 220 of the first horizontal portion 216 of bracket member 202. Likewise, openings $236_2$ provided on flange 246 meet and coincide with the openings 230 provided on first flange 226 of second horizontal member 218 of the bracket member 202. First reflector member 204 and second reflector member 206 are attached to bracket member 202 by any fastening means known to those skilled in the art. For example, all openings $236_1$, $236_2$, 224 and 230 on reflector member 204, 206 and bracket member 202 respectively can be provided with threads so as to communicate with bolts 248. Alternately, all of the openings $236_1$, $236_2$, 224 and 230 provided on first reflector member 204, second reflector member 206 and bracket member 202 respectively can allow for communication of a machine bolt 254 nut 256, riveting, spot welds, dowels, or the like therethrough.

First reflector member 204 is further provided with one or more lift pin access holes $258_1$ and $258_2$. Preferably, there are two such lift pin access holes disposed at angles of approximately +60° and −60° with respect to imaginary y-axis 262 as measured at origin point "0". Imaginary x-axis 264 is shown to complete the reference frame. Similarly, second reflector member 206 also comprises one or more lift pin access holes 260. Preferably there is one lift pin access hole provided at an angle of approximately 180° with respect to y-axis 262.

The bracket member 202 should be fashioned from materials suitable for attaching to the pedestal assembly 106 and supporting the reflector members 204 and 206. Such materials have high temperature strength and include but are not limited to stainless steel or alloys such as nickel or titanium based alloys (e.g., Inconel®) and is preferably stainless steel.

There are three design criteria for the selection of suitable materials for the reflector members 204 and 206 so that they reflect a substantial portion of thermal energy radiated from the susceptor 104 and pedestal assembly 106. First, they should be fabricated from a high temperature strength material; second, the material should be annealable and third, the material should have low emissivity properties. It is to be noted that a desired emissivity of a material can be achieved by coating or polishing if the raw material does not have a sufficient emissivity rating. Polishing increases the reflective properties of the material while coating prevents oxidation of a reflective surface. Emissivity is defined as the ratio of power radiated from a particular material to the power radiated from a blackbody substance at the same temperature. Ceramic materials (such as the susceptor) have a generally high emissivity on the order of 0.6 to 0.7 which makes them undesirable as reflectors. That is high emissivity materials absorb and then radiate a high degree energy, but do not reflect this energy. Highly emissive chamber components contribute to heat losses in the chamber. Low emissivity materials (on the order of 0.1–0.4) reflect a large amount of energy instead of absorbing and radiating a portion of the absorbed energy. Thus, low emissivity materials such as polished stainless steel or titanium, Inconel® plated with nickel (Ni), rhodium (Rh) or palladium (Pd) and preferably polished stainless steel is desirable for the reflector members. The reflector members can be further treated to enhance their reflective properties. For example, a stainless steel reflector member can be further polished to a highly reflective condition and/or subjected to a thermal stress relief process such as annealing to prevent oxidation or contamination of the highly reflective surface or warpage of the surface.

In operation, the reflector members 204 and 206 reflect the energy radiated from the backside 132 of the susceptor 104 and pedestal assembly 106 which can then be absorbed by these components. The reflected energy maintains the temperature of susceptor (and the pedestal assembly) within a critical operating regime. As such, less power is required from one or more of the chamber power supplies (i.e., 122 or 124) thus reducing operating costs. Additionally, since thermal energy is constantly "recycled" or reflected back to the susceptor, there is a greatly reduced amount of thermal stresses acting on the susceptor material. In other words, the shield 200 functions as a heat capacitor that is capable of "storing" thermal energy and providing it to the susceptor. Without such a device, the susceptor edge might radiate energy too quickly thereby causing thermal stressing and resultant fracturing of the susceptor 104. This advantage is particularly useful when it is required to power-down the chamber to perform ancillary tasks such as cleaning, repair or general maintenance. The shield 200 slows the radiative heat loss to an acceptable level as the susceptor cools to room temperature without needlessly sacrificing susceptor longevity. Of course the same holds true when it is time to ramp-up the susceptor temperature to begin wafer processing again. That is, the thermal ramp up across and around the entire susceptor is uniform.

There has thus been shown and described a novel apparatus for conserving and redirecting thermal energy within a ceramic susceptor that is heated by a resistive heater. Many changes, modifications, variations and other uses and applications of this subject invention will however become apparent to those skilled in the art after considering this specification and accompanying drawings which disclose the embodiments thereof. For example, the invention may be applicable in not only a PVD chamber, but in any vacuum processing environment where increased thermal control of processing components is desired. Such environments include CVD and ETCH chambers or other such chambers employing ceramic susceptors in high temperature applications. All such changes, modifications, variations and other uses and applications which do not depart from the spirit and scope of the invention are deemed to be covered by the invention, which is to be limited only by the claims which follow.

What is claimed is:

1. Apparatus for redirecting energy applied to a susceptor attached to a pedestal assembly in a substrate process chamber, the apparatus comprising:

a bracket member attached to the pedestal assembly; the bracket member further comprising a first horizontal portion and a second horizontal portion, said first horizontal portion further comprising a first flange and a second flange and said second horizontal portion further comprising a first flange and a second flange, said first and second flanges of the first horizontal portion further comprising a plurality of flange openings and said first and second flanges of the second horizontal portion further comprising a plurality of flange openings; and a first reflector member attached to and supported by said bracket member and a second reflector member attached to and supported by said bracket member, wherein the first reflector member has a first end and a second end and the second reflector member has a first end and a second end, each of said first and second ends of said first and second reflector members is further provided with a flange and the flange on the first end of the first reflector member is further provided with a plurality of openings that coincide with the plurality of openings on the second flange of the first horizontal portion of the bracket member and the flange on the second end of the first reflector member is further provided with a plurality of openings that coincide with the plurality of openings on the second flange of the second horizontal portion of the bracket member.

2. The apparatus of claim 1 wherein said reflector members are disposed below said susceptor.

3. The apparatus of claim 2 wherein said reflector members reflect thermal energy radiated from a backside of said susceptor.

4. The apparatus of claim 1 wherein the bracket member further comprises an arcuate portion.

5. The apparatus of claim 4 wherein the arcuate portion is provided with a plurality of openings.

6. The apparatus of claim 5 further comprising a plurality of fastening means communicating with said arcuate portion openings and said pedestal assembly.

7. The apparatus of claim 6 wherein the plurality of arcuate portion openings is four and the plurality of fastening means is four.

8. The apparatus of claim 4 wherein the bracket member further comprises a first vertical portion transitioning horizontal portion of the bracket member and the flange on the second end of the first reflector member is further provided with a plurality of openings that coincide with the plurality of openings on the second flange of the second horizontal portion of the bracket member.

9. The apparatus of claim 1 wherein said pluralities of flange openings is three openings per flange.

10. The apparatus of claim 1 wherein the flange on the first end of the second reflector member is further provided with a plurality of openings that coincide with the plurality of openings on the first flange of the first horizontal portion of the bracket member and the flange on the second end of the second reflector member is further provided with a plurality of openings that coincide with the plurality of openings on the first flange of the second horizontal portion of the bracket member.

11. The apparatus of claim 10 wherein the first and second reflector members are attached to the bracket member via communication of a fastening means with the coinciding plurality of openings.

12. The apparatus of claim 11 wherein the fastening means are selected from the group consisting of bolts, nut and bolt pairings, rivets welds and dowels.

13. The apparatus of claim 1 further comprising one or more lift pin access holes provided on each of said first and second reflector members.

14. The apparatus of claim 13 wherein there are two lift pin access holes provided on the first reflector member and there is one lift pin access hole provided on the second reflector member.

15. The apparatus of claim 1 wherein the first and second reflector members are fabricated from a low emissivity material.

16. The apparatus of claim 15 wherein the first and second reflector members are stainless steel.

17. The apparatus of claim 16 wherein the first and second reflector members are polished to a highly reflective condition.

18. The apparatus of claim 16 wherein the first and second reflector members are annealed.

* * * * *